United States Patent [19]
Hill et al.

[11] Patent Number: 5,905,753
[45] Date of Patent: May 18, 1999

[54] FREE-STANDING ROTATIONAL ROD-FED SOURCE

[75] Inventors: Russell J. Hill, El Cerrito; P. A. Joel Smith, San Pablo; Ping Chang, Danville, all of Calif.

[73] Assignee: The BOC Group, Inc., New Providence, N.J.

[21] Appl. No.: 08/880,246

[22] Filed: Jun. 23, 1997

[51] Int. Cl.$^6$ .................................................. H01J 37/305
[52] U.S. Cl. .................... 373/11; 373/14; 219/121.11
[58] Field of Search ...................... 373/10–17; 432/264; 219/121.11, 121.12, 121.15

[56]  References Cited

U.S. PATENT DOCUMENTS

| | | | |
|---|---|---|---|
| 3,377,419 | 4/1968 | Schiller et al. | 373/10 |
| 3,454,814 | 7/1969 | Mancebo | 373/11 |
| 3,730,962 | 5/1973 | Norwald | 373/11 |
| 4,027,093 | 5/1977 | Kibbish | 373/15 |
| 4,130,416 | 12/1978 | Zaboronok et al. | 373/15 |
| 4,613,306 | 9/1986 | Bauer et al. | 373/10 |

OTHER PUBLICATIONS

Physical Vapor Deposition; Hill, Russell J., ed.; Temescal; 1976.

*Primary Examiner*—Tu Ba Hoang
*Attorney, Agent, or Firm*—David A. Draegert; Salvatore P. Pace

[57] ABSTRACT

In a rotational rod-fed electron-beam evaporation source used with sublimating rod material, the ingot rod can be free-standing with respect to the crucible. This means that the side of the ingot rod near the tip of the rod does not contact a cooling crucible. In this way, the system can be operated in a defocused position of the electron beam, and the sweep of the electron beam can go over the edge of the ingot rod tip. Using these features, a substantially radial sweep of the tip of an ingot rod that sweeps over the edge can produce a substantially flat evaporation pattern on the ingot rod, producing a good utilization of the expensive ingot rod material.

19 Claims, 7 Drawing Sheets

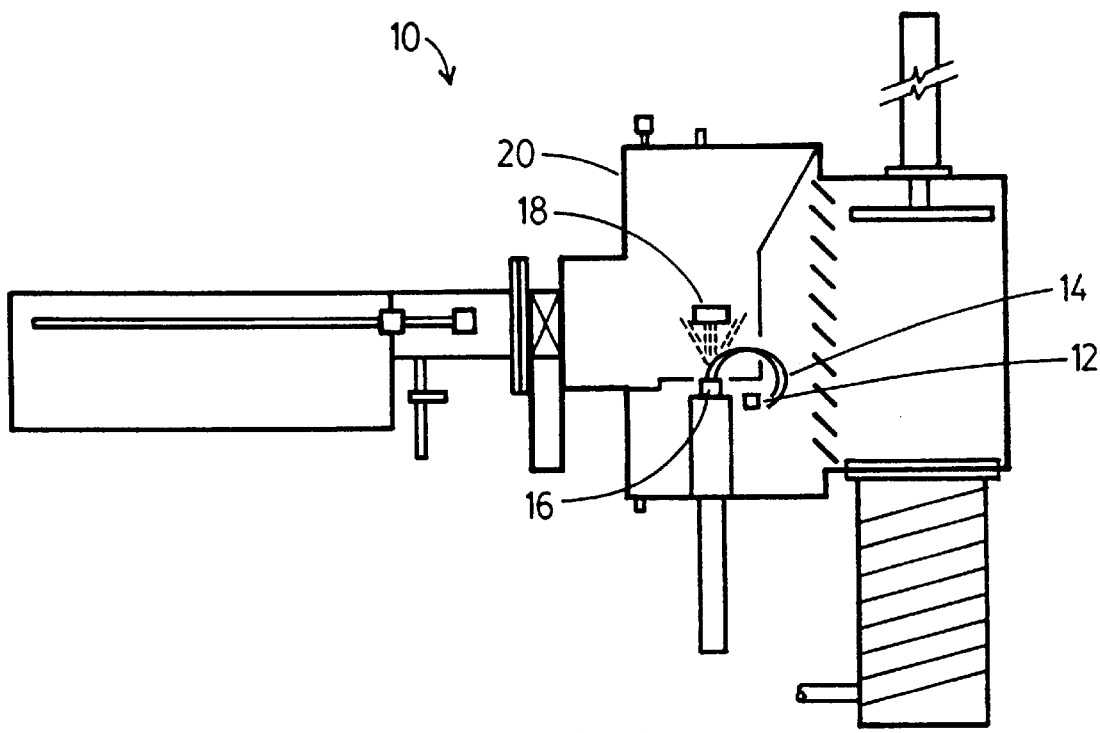
FIG._1.
(PRIOR ART)
Transverse Magnetic Field
for ⊙ 270° Deflection
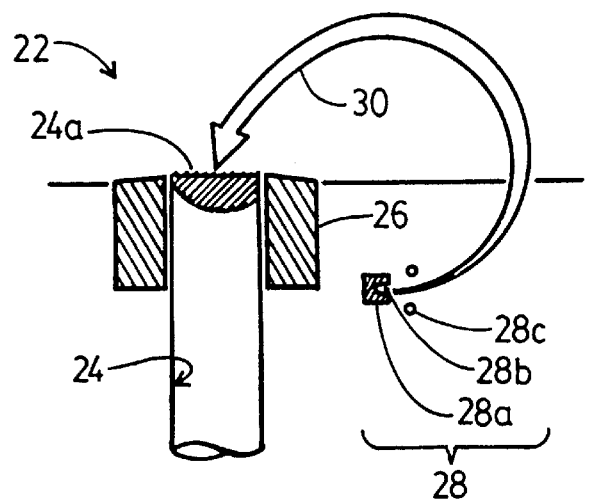
FIG._2.
(PRIOR ART)

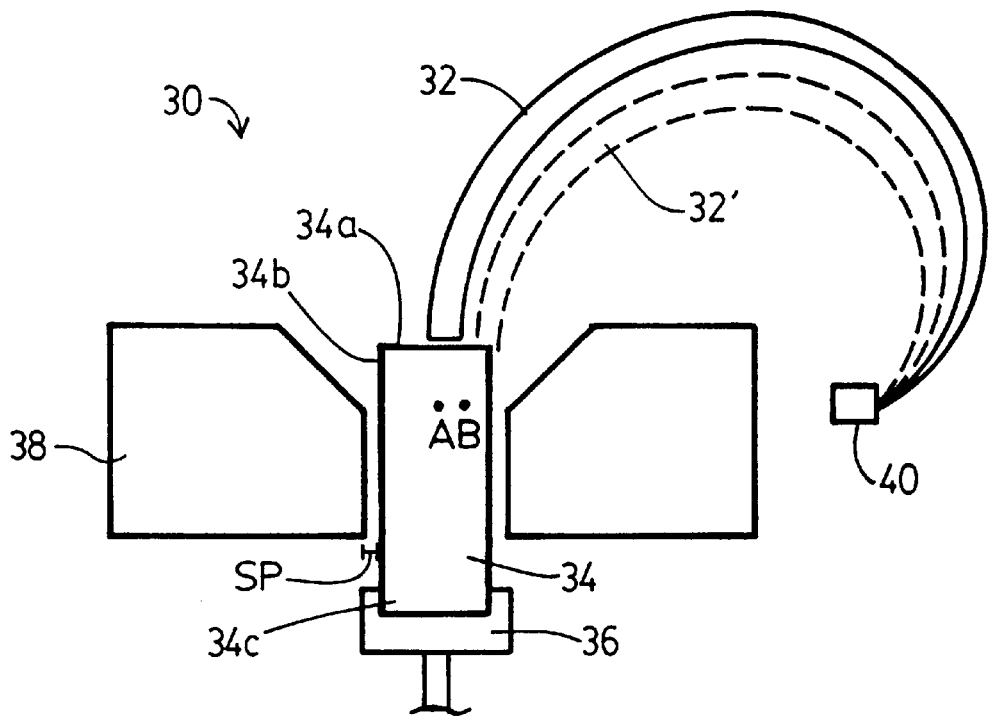
FIG._3.
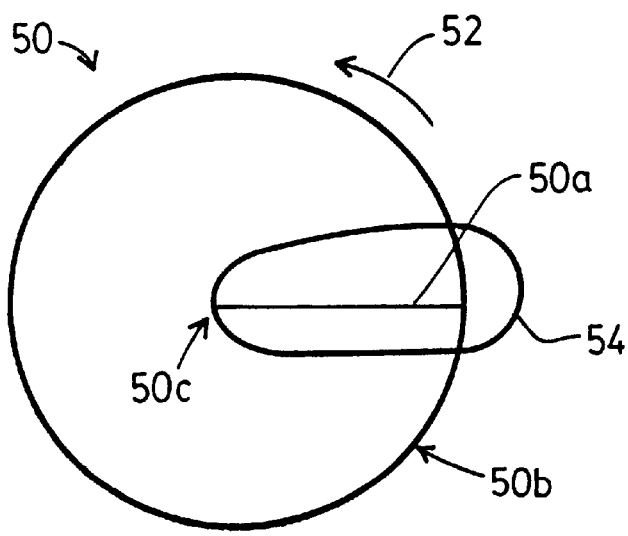
FIG._4.

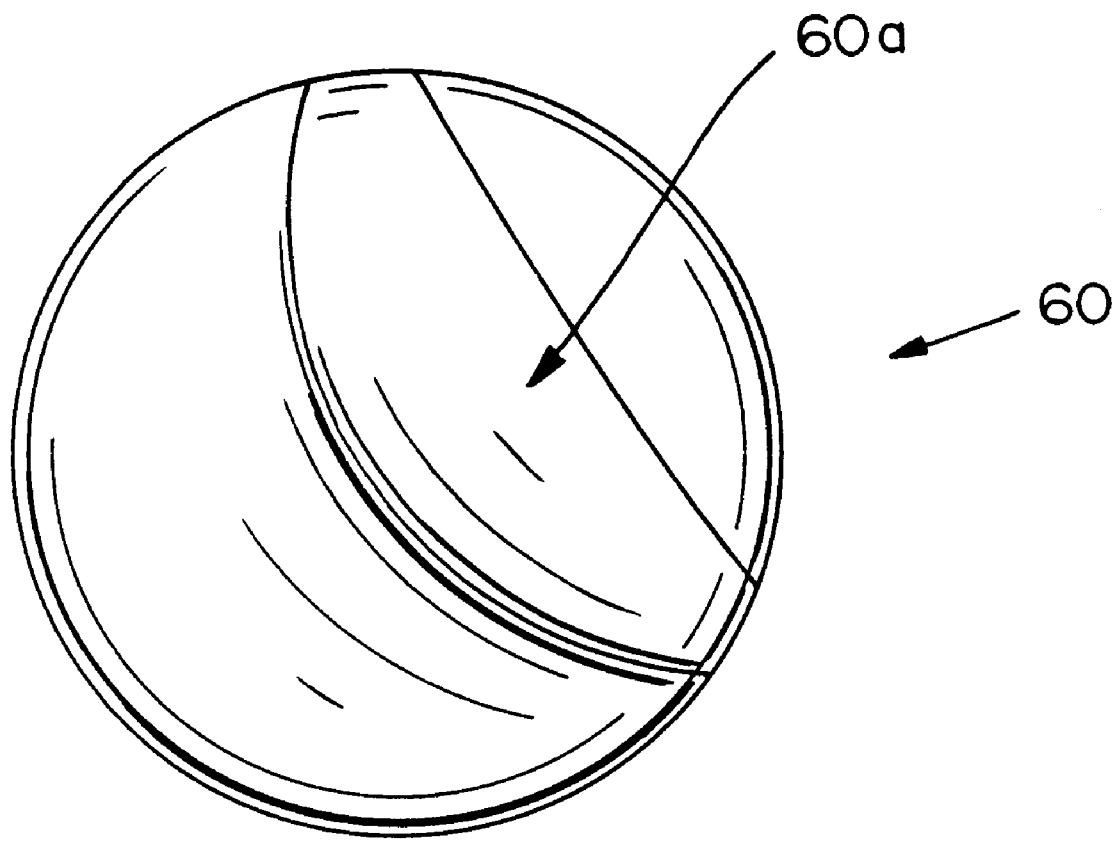
FIG._5.
(PRIOR ART)

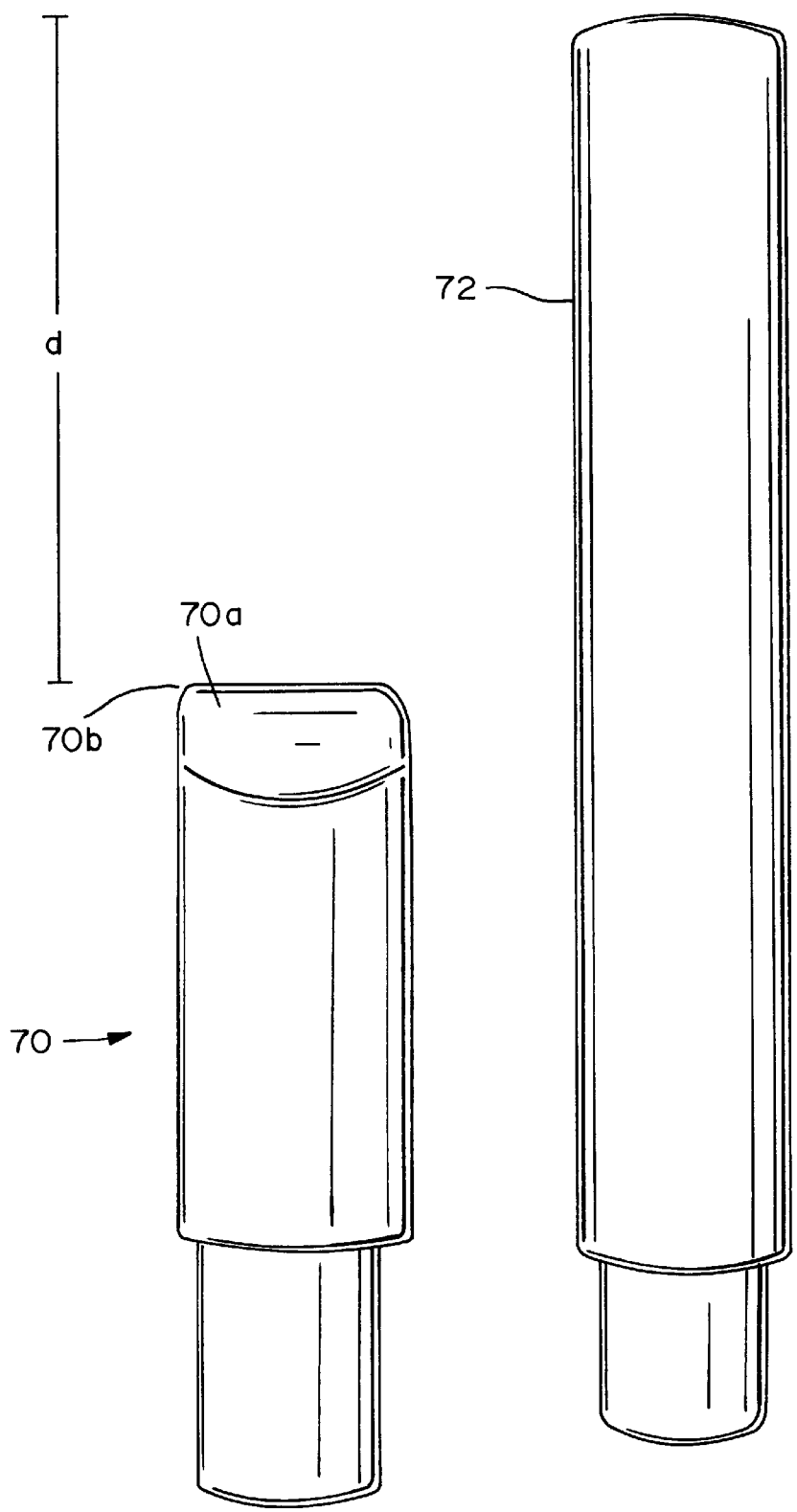
FIG._6A.
FIG._6B.

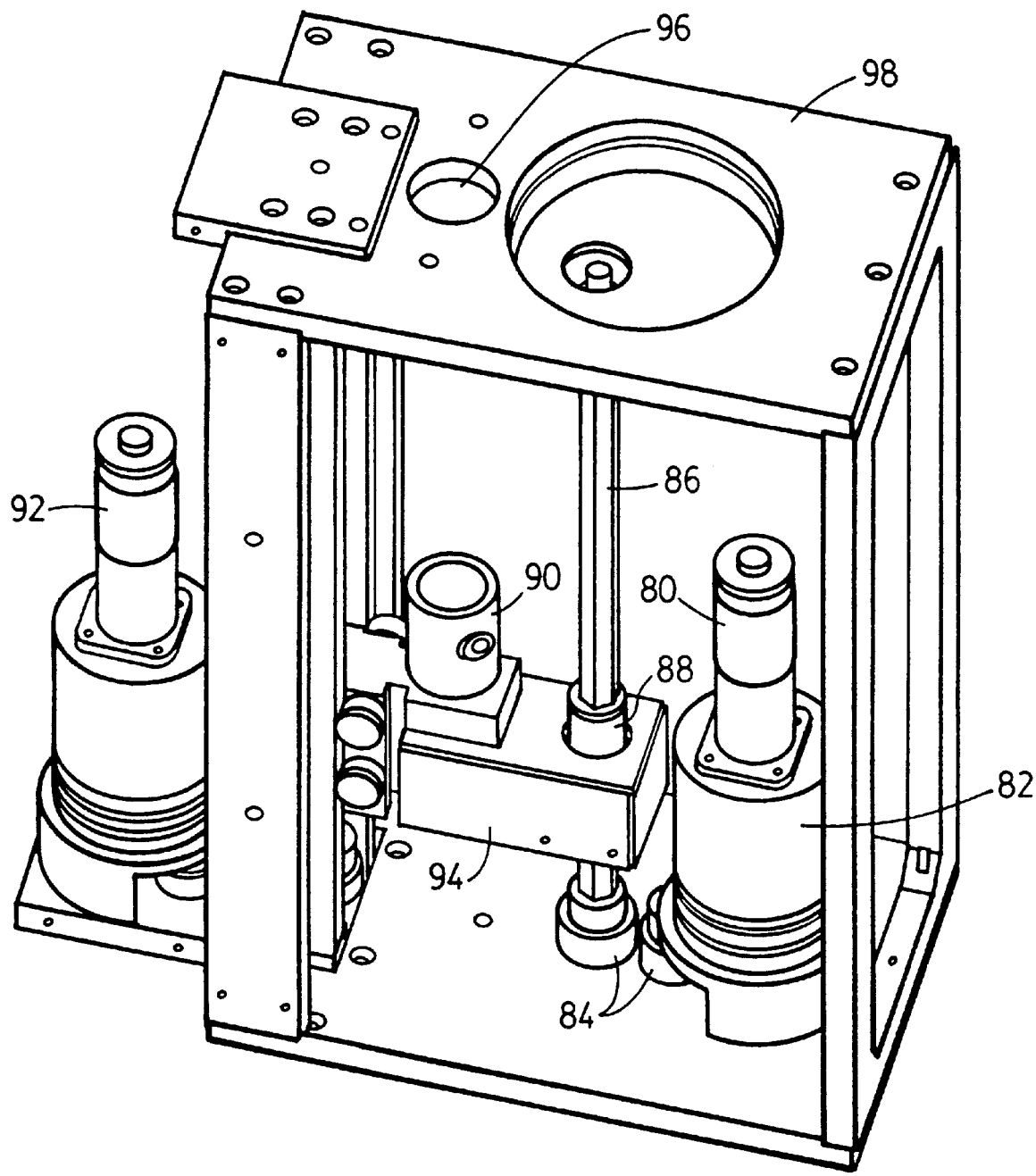
FIG._7.

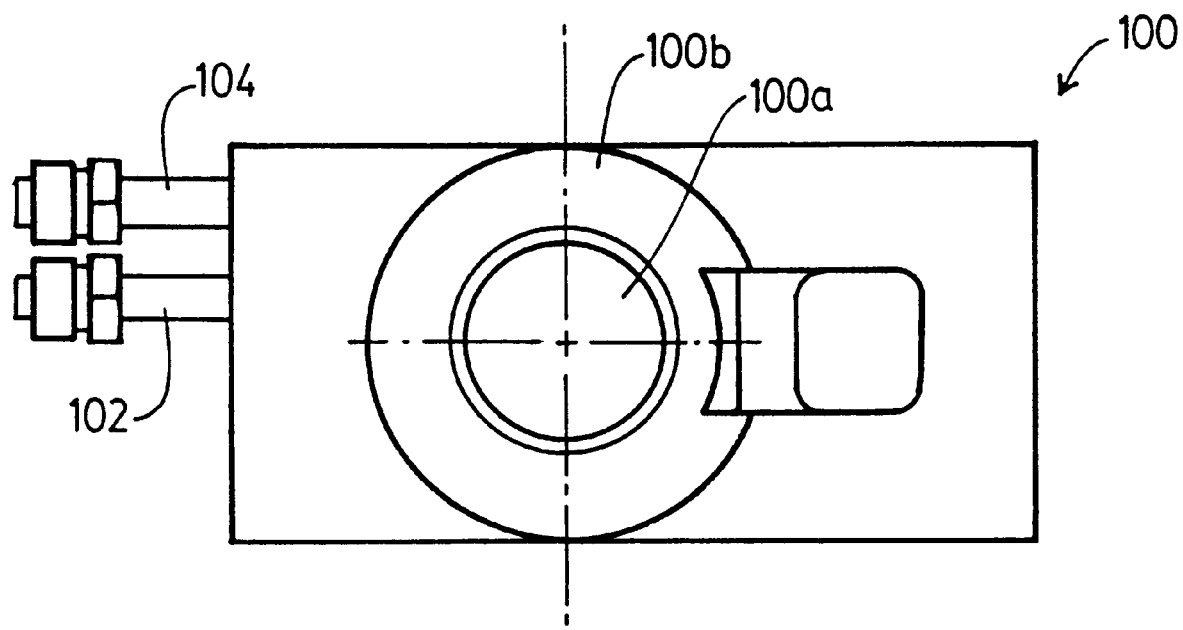
FIG._8A.
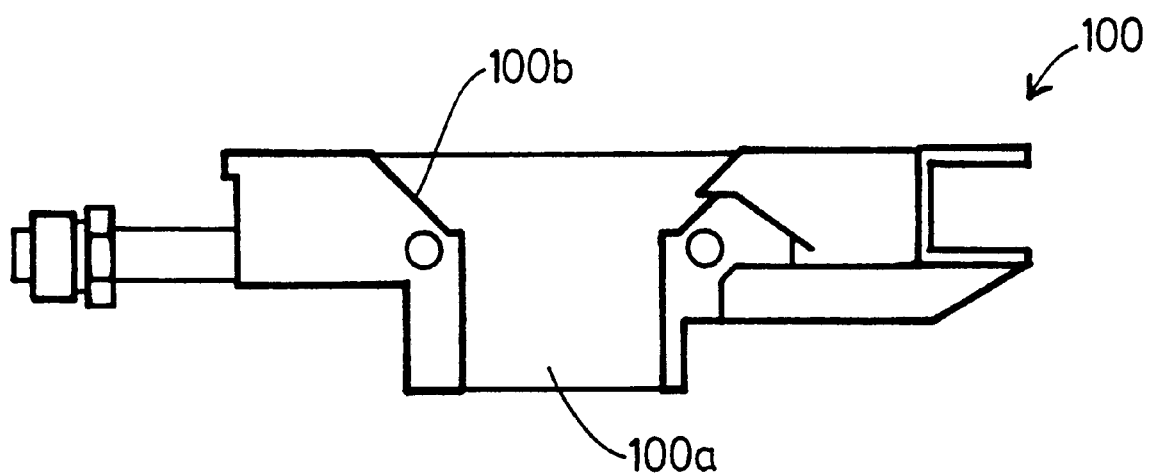
FIG._8B.

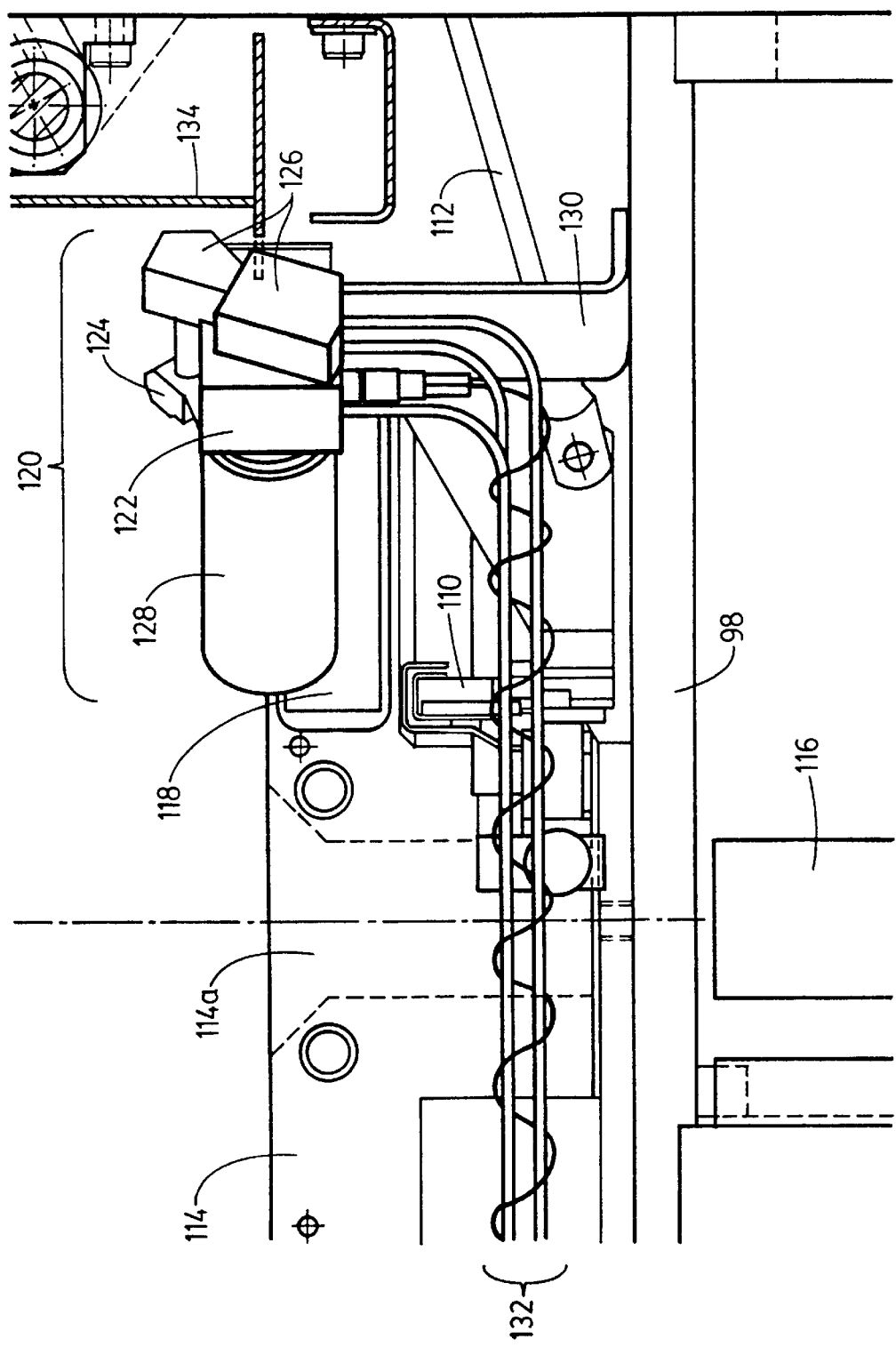
FIG._9.

FREE-STANDING ROTATIONAL ROD-FED SOURCE

BACKGROUND OF THE INVENTION

The present invention relates to electron-beam evaporation systems, especially electron-beam evaporation systems for use with rod materials that sublimate when heated with an electron beam at low pressures.

Electron-beam evaporation systems direct an electron beam to an ingot material to evaporate this material and coat a substrate. A discussion of electron-beam technology is given in the book *Physical Vapor Deposition,* R. Hill, ed., 1986, Second Edition, at pages 17–106, which is incorporated herein by reference. FIG. 1 is a diagram illustrating a prior art electron-beam evaporation system adapted from page 64 of *Physical Vapor Deposition.* The system 10 includes an electron beam source 12 which supplies an electron beam 14 to contact an ingot material positioned in the crucible 16. The evaporated ingot material is deposited on the substrate 18 in the process chamber 20.

FIG. 2 is a diagram of a prior art system adapted from page 39 of *Physical Vapor Deposition.* This reference uses feed stock 24 contacting a water-cooled crucible 26. As the material of the feed stock evaporates, the feed stock can be pushed upward to provide a continuous supply of the feed stock. In this diagram, the feed stock is not a subliming material, so a liquid inventory 24a is formed. The electron beam source 28 includes a cathode block 28a, a filament 28b, and anodes 28c. Permanent magnets cause the 270° deflection of the electron beam 30 so that the electron beam 30 contacts the material of the rod 24.

It is also possible to use subliming materials that do not produce a liquid inventory 24a. Subliming materials have the problem that, since no liquid inventory is formed, hot spots on the ingot surface can occur. The electron beam may drill into the ingot material at the hot spot so that the erosion from the ingot surface is not even. This can require the ingot to be replaced when only a small percentage of the ingot was used. In order to avoid some of these problems, sweep mechanisms are used. One type of sweep mechanism is called X-Y sweep, because it varies the longitudinal and lateral positioning of the beam with a variable amplitude and frequency for each axis. This enables the electron beam spot to be swept more uniformly over a wide range of source sizes. The X-Y sweep is used in conjunction with a continuous rod rotation and feed. A Temescal Model SRIHS-270-2 rod-fed electron gun uses such a rod feed and rotation mechanism, as well as an X-Y sweep mechanism.

A disadvantage of prior art rotational rod-fed systems is that it is difficult to maintain a uniform power density and thus evaporation rate off of the rod tip. It is desired to have an improved electron-beam evaporation system.

SUMMARY OF THE INVENTION

The present invention comprises using the ingot rod in a free-standing position so that the ingot rod does not contact the crucible near the tip of the rod. Preferably, the ingot rod does not contact the cooling crucible at all. The applicants have found that there are advantages of not contacting the crucible when the ingot rod material sublimes. Having the rod in the free-standing position allows the operation of the electron-beam evaporating system in a defocused position. The electron beam from the electron beam source is roughly focused due to the 270° magnetic deflection. Typically, the prior art systems are set up so that the focal point of the electron beam is near the tip of the rod. This allows for relatively high energy density. When the ingot rod is in the free-standing position, the ingot rod can be positioned so that the focal point of the electron beam would be below the tip of the ingot rod.

In prior art systems, since the tip of the ingot rod is near the crucible, in order to sweep the edges of the ingot tip without hitting the crucible with the electron beam, the electron beam needs to be at least somewhat in focus. Since the tip is free-standing in the present invention, a de-focused beam can sweep somewhat over the edge of the ingot rod tip. The de-focused position has the advantage of allowing a more even application of the electron-beam energy, and may help avoid hot spots.

The ability to sweep the electron-beam energy over the edge of the tip of the rod is another advantage allowed by the free-standing position of the ingot rod. When the sweep goes over the edge of the ingot rod tip, since the ingot rod is free-standing, the electron beam does not contact the crucible.

The de-focused position of the ingot rod allowed in the present invention helps ensure that the electron beam, when it sweeps over the edge, does not contact the crucible. This is because the electron beam focuses to a point within the rod below the tip of the ingot rod. Thus, none of the electron-beam energy misses the rod and impinges upon the crucible.

Since the electron-beam energy can be swept over the edge of the ingot rod, the power density at the edges can be increased. This is an advantage because a radial sweep of the ingot tip can then be done. Sweeping the electron beam along the radius of the tip of the ingot rod has the advantage that it reduces the area of the sweep. A potential disadvantage of sweeping along the radius is that the power density near the edges can be relatively low. This may cause more material to be evaporated from the center than the edges of the tip. A ridge may be produced at the edge of the tip.

By sweeping over the edge of the rod tip, additional material from the edge portion can be evaporated, thus producing a relatively flat evaporation pattern.

It is important to have a relatively flat evaporation pattern because this allows for a good utilization of ingot rod. If the electron beam bores down in one location, the electron beam can contact the pusher material, and the ingot rod will need to be replaced. Ingot rods are relatively expensive. For example, chromium rods currently cost about $500.00. It is important to get as much use of each ingot rod as possible.

The inventive concepts of the present invention further include the operation of the device in the de-focused position, the sweeping of the electron-beam energy over the edge of the tip of the ingot rod, and the sweeping of the electron-beam energy substantially along a radius of the ingot rod.

BRIEF DESCRIPTION OF THE DRAWINGS

The above and other features and aspects of the present invention will become more apparent upon the reading of the following detailed description in conjunction with the accompanying drawings, in which:

FIG. 1 is a diagram of a prior art electron-beam evaporation system in a vacuum process chamber.

FIG. 2 is a diagram of a prior art electron-beam evaporation system.

FIG. 3 is a diagram of an electron-beam evaporation system of the present invention illustrating two electron-beam scan positions.

FIG. 4 is a diagram of the tip of the ingot rod illustrating the ingot rod rotation and showing an illustrative sweep pattern.

FIG. 5 is a diagram illustrating the wear pattern of a prior art chromium ingot.

FIG. 6A is a diagram illustrating the wear of a chromium rod in the electron-beam evaporation system of the present invention.

FIG. 6B is a diagram illustrating an unworn chromium rod for use with the electron-beam evaporation system of the present invention.

FIG. 7 is a diagram illustrating some of the parts of the electron-beam evaporation system of the present invention.

FIG. 8A is a cross-sectional view of a crucible for use with the electron-beam evaporation system of the present invention.

FIG. 8B is a top view of the crucible of FIG. 8A.

FIG. 9 is a diagram illustrating some of the elements of the electron-beam evaporation system of the present invention.

DETAILED DESCRIPTION OF THE PREFERRED EMBODIMENT

FIG. 3 is a diagram of an electron-beam evaporation system 30 of the present invention illustrating an electron beam 32 in two electron-beam sweep positions 32 and 32'. System 30 shows a rod 34. The rod 34 includes a tip portion 34a, a side portion 34b, and a bottom portion 34c. The bottom portion of the rod 34 is positioned in a rotating mechanism 36 and also connected to a feed mechanism (not shown). In a preferred embodiment, the rod material is a subliming material. In a preferred embodiment, this rod is made of chromium. Other subliming materials such as silicon dioxide, titanium dioxide, yttria-stabilized zirconia, $HfO_2$, and $Nd_2O_3$ can also be used with the present invention. As shown, the rod 34 is free-standing, which means that the side of the rod near the tip does not contact the crucible 38. In a preferred embodiment, the entire rod does not contact the cooling crucible 38. It is against conventional wisdom for the rod to not contact the cooling crucible. As described below, the free-standing rod produces a number of advantages. The electron-beam source 40 is preferably of the type that provides a deflection of 270° caused by permanent magnets (not shown) and allows for an X-Y scan deflection caused by an electric current passing through a deflector coil (not shown). In the preferred embodiment, the electron-beam emitter is a Temescal high-performance emitter Type SFIH-270-2 available from BOC Coating Technology of Fairfield, Calif.

The electron beam 32 is shown in two positions 32 and 32'. In position 32', the electron beam sweeps over the edge of the ingot tip to the ingot rod side. This allows for evaporation of material from the side of the rod. If the side of the rod near the tip were in contact with the crucible, the electron beam would not be able to sweep the side of the ingot rod and would instead impinge upon the crucible.

The free-standing ingot rod 34 allows for the system to be used in a defocused position. The defocused position helps ensure that the electron beam can sweep the side of the rod but will not impinge upon the crucible. Additionally, the defocused position allows for a more uniform sweep of the ingot rod. In a preferred embodiment, the tip of the ingot rod 34 is positioned above the focal point for the electron beam 32. The tip of the ingot rod 34 is preferably about 1½ inches higher than was done before. As shown in FIG. 3, electron beam 32 would have a focal point at point A. Electron beam 32' would have a focal point at point B.

The importance of sweeping the sides of the ingot rod with the electron beam can be best seen with respect to FIG. 4. FIG. 4 is a diagram illustrating an ingot rod tip 50. The ingot rod tip 50 is rotated as shown in arrow 52.

In a preferred embodiment, the electron beam sweeps substantially about the radius 50a of the tip 50. A sweep about a radius of the tip is easier to control than a full sweep of the entire tip of the ingot rod. A smaller area need be swept, so that the power density can be maintained relatively uniform. However, if the supplied electron-beam power was completely uniform along the linear radius 50a, the power density at the edge 50b of the tip 50 would be less than the power density at the center 50c of the tip 50. This would result in a ridge forming around the edge 50b because the material of the edge 50b would not evaporate as quickly as the material at the center 50c. By sweeping over the edge, as shown in sweep pattern 54, the material at the edge 50b is evaporated more quickly, and a more even evaporation pattern is produced at the tip 50.

Operating in the defocused position can help reduce the power density at the center and thus produce a more even erosion pattern. The sweep pattern 54 can be set so that only a part of the electron beam will sweep the center 50c of the tip 50. This can help reduce the amount that evaporates from the center 50c as compared to the edge 50b.

The preferred embodiment of the present invention produces a chromium evaporation rate of 30 Angstroms per second, 58 inches above the source, at 3 kilowatts of power. This is much better than the prior art deposition rate described below. In a preferred embodiment, the supplied power from the electron beam is set at about two to three kilowatts. In the present invention, since the tip of the rod is evenly eroded, almost the entire chromium rod can be used. Other subliming materials will also evaporate more evenly with the electron-beam evaporation system of the present invention.

FIG. 5 is a diagram illustrating the wear pattern of a chromium ingot used in a prior art electron-beam evaporation system. The ingot 60 is made of a chromium material. As discussed above, the chromium sublimes when heated by the electron beam. Since the electron-beam evaporation is done in a high vacuum, the chromium does not reach the molten stage, and the erosion is very localized. To prevent the evaporation from being too localized, the electron beam has to be swept at a high frequency, and with a large amplitude, to cover the entire chromium surface. The chromium evaporation rate, from a 67 cc. crucible source, has been found to be three to four Angstroms per second, 42 inches above the source, at 5.5 kilowatts. Since the electron beam has to be swept over almost four square inches in the case of a 67 cc. ingot, the power density of the electron beam inevitably varies over such a large area and the evaporation rate differs from spot to spot. Eventually, the evaporation will be more severe at a certain spot, and the electron beam will tunnel into the chromium. Plasma focusing will make the evaporation more and more localized. This is illustrated by area 60a of the ingot 60. The evaporation rate diminishes since a smaller area is being evaporated from, and soon the chromium rod has to be replaced. For the non-rod-fed ingot source used with the FIG. 5, only about fifteen percent of the initial volume will be consumed before the rest of the ingot rod needs to be discarded.

FIG. 6A is a diagram illustrating the wear of a chromium rod used with one embodiment of the present invention.

Note that the rod 70 is substantially flat at the tip 70*a*. The rod does have some small ridges at the tip. This flat shape remains after evaporating the chrome rod a distance d. Note that substantially all of the chromium rod 70 can be used. Also note that in location 70*b*, the evaporant system of the present invention wears around the sides of the ingot rod 70 to aid in providing the relatively uniform evaporation from the tip 70*a*.

FIG. 6B illustrates an unworn chromium rod 72 for use with the electron-beam evaporation system of the present invention. Note that, in a preferred embodiment, the chromium rod 72 is about 1¼ inches in diameter.

FIG. 7 illustrates some of the parts used in a preferred embodiment of the electron-beam evaporation system of the present invention. The crucible and the electron-beam source are not shown in this figure. A motor 80 connected to a motor mount 82 drives gears 84 to cause rotation in the hexagonal drive rod 86. This rotation is translated from the hex sleeve 88 to the clamps 90 and thus the ingot rod. The motor 80 controls the speed of the rotation of the rod (not shown) clamped into clamp 90. The rotation is translated to the hexagonal drive rod 86 whatever the vertical position of the hexagonal sleeve 88, because the hexagonal sleeve 88 slidably fits into the hexagonal drive shaft 86. Motor 92 controls the vertical position of the unit 94, including the rod clamp 90. In this way, the rod can be fed up to the crucible (not shown) and rotated using motor 92 and rotated using motor 86. Rotation speed and the rod feeding is controlled by the power supplied to the motors 80 and 92, respectively. The crucible (not shown) is connected at position 96. The crucible is shown in FIGS. 8A and 8B below. Additional elements shown in FIG. 9 are placed on the drive base top 98.

In a preferred embodiment, the motor 80 is a Globe Motor Part No. M319M118 available from Globe Motor of Dayton, Ohio. In a preferred embodiment, the rod is rotated at around 30 revolutions per minute (RPM) during the evaporation process. Other revolution speeds can be used.

FIG. 8A is a cross-sectional drawing illustrating a crucible 100 for use with the present invention. The crucible has an opening 100*a* to allow the rod to be fed through. Note that, in a preferred embodiment, the crucible widens out into a V-shape at area 100*b*. As shown in FIG. 8B, the crucible 100 is water-cooled through pipes 102 and 104. As discussed above in the preferred embodiment, the rod placed into the crucible does not contact the crucible, so that the diameter of the hole 100*a* is wider than the ingot rod. The ingot rod, in a preferred embodiment, is about 1¼ inches in diameter.

FIG. 9 is a diagram illustrating additional elements of one embodiment of the electron-beam evaporation system of the present invention. The elements shown in FIG. 9 are placed on the drive base top 98 of FIG. 7. The electron-beam gun 100 is preferably a Temescal high-performance emitter SFIH-270-2. The high-voltage filament lead 112 is connected to the emitter of the electron gun 110. A crucible 114 includes a through-hole 114*a* for a rod 116 to be fed therein. The electron-beam gun 110 has an associated deflection coil 118 that allows for the X and Y positioning of the electron-beam sweep onto the rod 116. In a preferred embodiment, the longitudinal sweep is driven by a signal having an amplitude of 0.5 to 0.7 amperes, with a sweep frequency of 4 Hertz, where the lateral sweep has a sweep frequency of 4 Hertz over an amplitude of −0.2 to +0.1 amperes.

The electron-beam evaporation system of the present invention can be used in conjunction with a monitoring device. A conventional monitoring device can be used where the monitor is positioned at about the same location as the substrate to give an indication of the amount of deposition material produced. In this way, a closed-loop control of the evaporation rate can be done by feeding back the detector signal to control a system parameter, preferably the power supply to the electron beam gun, to maintain a constant deposition rate. In one embodiment, the detector is a surface wave crystal detector whose frequency changes with the addition of deposited material.

Additionally, as shown in FIG. 9, an inventive pool-height monitor can be used in conjunction with the present invention. The pool-height monitor is described in a patent application entitled "Rod-Fed Source of Pool Height Monitor," having inventors P. A. Joel Smith and Ping Chang, which is filed concurrently with the present case, and is incorporated herein by reference. Briefly, as shown in FIG. 9, the pool-height monitor 120 includes a crystal holder 122, a shutter 124, a shutter actuator 126, and a collimating tube 128. These elements are mounted on a bracket 130. The detector points at a position about level with the crucible surface so that the detector determines when the rod is positioned slightly above the crucible surface. When this occurs, some of the evaporated material will move in a straight line through collimating tube 128 to the detector 122. Once a signal is detected, the system knows that the tip of the rod 116 is positioned slightly above the surface of the crucible 114. In this way, the rod 116 can be positioned before a substrate is coated. No windows that can become coated or flushing gases are required. The shutter 124 can close once the position of the rod 116 is determined. In this way, excessive coating of the crystal in the detector 122 is prevented.

Also shown in FIG. 9 is the coolant and electrical lines 132 and the shielding 134.

Various details of the implementation and method are merely illustrative of the invention. It will be understood that various changes of details may be within the scope of the invention, which is to be limited only by the appended claims.

What is claimed is:

1. An electron-beam evaporation system comprising:

an ingot rod, the ingot rod having a bottom end, a tip, and a side;

a source of an electron beam capable of evaporating the ingot rod such that the tip remains relatively flat as it is evaporated; and a rotation mechanism connected to the bottom end and adapted to rotate the ingot rod while the source acts on the tip, wherein the ingot rod is free-standing so that the ingot rod does not contact a cooling crucible at the side near the tip.

2. The electron-beam evaporation system of claim 1, wherein the source is adapted to sweep an electron beam substantially along a radius of the tip, the sweep going beyond an edge of the tip to evaporate material from the side.

3. The electron-beam evaporation system of claim 1, wherein the source defines a focal point for the electron beam and wherein the tip is positioned above the focal point.

4. The electron-beam evaporation system of claim 1, wherein the ingot rod comprises a material that sublimes when heated by the electron beam in a low-pressure environment.

5. The electron-beam evaporation system of claim 4, wherein the ingot rod comprises chromium metal.

6. The electron-beam evaporation system of claim 1, wherein the ingot rod includes a cylindrical portion defining a central longitudinal axis and wherein the rotation mechanism rotates the ingot rod about the central longitudinal axis.

7. The electron-beam evaporation system of claim 1, wherein the source comprises a gun to produce the electron beam and a magnet to deflect the electron beam through an arc of about 270 degrees.

8. The electron-beam evaporation system of claim 1, wherein the source further comprises magnetic coils that can deflect the electron beam to form a sweeping pattern on the ingot rod.

9. The electron-beam evaporation system of claim 8, wherein the source is adapted to sweep the electron beam substantially along a radius of the ingot rod.

10. The electron-beam evaporation system of claim 1, wherein the rotation mechanism comprises a motor.

11. The electron-beam evaporation system of claim 1, further comprising a rod-feeding mechanism.

12. A method of evaporating material from an ingot rod comprising:
   rotating a free-standing ingot rod such that the ingot rod does not contact a cooling crucible at a side of the ingot rod near a tip of the ingot rod; and
   evaporating material from the tip with an electron beam while the ingot rod is rotating, the evaporating being such that the tip remains relatively flat as it is evaporated.

13. The method of claim 12, wherein the evaporating includes sweeping the electron beam beyond an edge of the tip.

14. The method of claim 12, wherein the evaporating comprises subliming the material of the ingot rod with the electron beam in a low-pressure environment.

15. The method of claim 14, wherein the ingot rod is made of chromium.

16. The method of claim 12, wherein the evaporating includes focusing the electron beam at a focal point positioned below the tip.

17. The method of claim 12, wherein the ingot rod includes a cylindrical portion defining a central longitudinal axis and wherein the rotating comprises rotating the ingot rod about the central longitudinal axis.

18. The method of claim 12, wherein the evaporating includes sweeping the tip with the electron beam.

19. The method of claim 18, wherein the evaporating includes sweeping substantially along a radius of the tip with the electron beam.

* * * * *